United States Patent [19]
Mei et al.

[11] Patent Number: 5,871,826
[45] Date of Patent: Feb. 16, 1999

[54] PROXIMITY LASER DOPING TECHNIQUE FOR ELECTRONIC MATERIALS

[75] Inventors: Ping Mei, Palo Alto; René A. Lujan, Santa Clara; James B. Boyce, Los Altos, all of Calif.

[73] Assignee: Xerox Corporation, Stamford, Conn.

[21] Appl. No.: 655,549

[22] Filed: May 30, 1996

[51] Int. Cl.$^6$ .................................................... B05D 3/06
[52] U.S. Cl. .......................... 427/596; 427/282; 438/535
[58] Field of Search ............................ 427/596, 62, 282; 438/149, 535

[56] References Cited

U.S. PATENT DOCUMENTS

| | | | |
|---|---|---|---|
| 4,556,437 | 12/1985 | Molee ...................................... | 148/188 |
| 4,642,144 | 2/1987 | Tiedje et al. ............................ | 148/175 |
| 4,661,177 | 4/1987 | Powell .................................... | 148/189 |
| 4,714,628 | 12/1987 | Eloy ....................................... | 427/53.1 |
| 4,970,196 | 11/1990 | Kim et al. .................................. | 505/1 |

OTHER PUBLICATIONS

Fogarassy et al, J. Appl. Phys. 66(1), Jul. 1989, pp. 457–459.

Kono, N., Nagahara, T., Fujimoto, K., Kashiwagi, Y., Kakinoki, H., "Low Temperature Fabrication of Poly–Si TFTs Using In–Situ Chemically Cleaning Method," Mat. Res. Soc. Symp., v.283 (1993, pp. 629–634.

Chenevas–Paule, A., Diem, B.,Leroux, T., and Truche, "Self-Aligned a–Si:H TFT: A New Way to Design Active–Matrix LCDs," Proceedings of the SID, vol. 26/3, 1985, pp. 197–200.

Kim, C. and Matsumura, M., "Sub–$\mu$m Long Amorphous--Silicon Thin–Film Transistors," Dept. of Physical Electronics, Tokyo Institute of Technology, O–kayama, Meguro–ku, Tokyo 152, Japan, pp. 119–120.

Carey, P.G., Sigmon, T.W., Senior Member, IEEE; Press, R.L., Fahlen, T.S., "Ultra–Shallow High–Concentration Boron Profiles for CMOS Processing," IEEE Electron Device Letters, vol. EDL–6, No. 6, Jun. 1985, pp. 291–293.

Mei, P. Boyce, J.B., Fork, D.K., Hack, M., Lujan, R. and Ready, S.E., "Poly–Si Peripheral Circuits and Contact Properties of Laser Processed Poly–Si Thin Film Transistors," Proc. The 4th Intl. Conf. on Solid–State and Integrate–Circuit Technology (1995). pp. 721–723.

Sakoda, T., Kim, C., Matsumura, M., "In–Situ Crystallization and Doping of a–Si Film by Means of Spin–On–Glass," MRS Symposijm Proceedings, vol. 345, 1994, pp. 59–64.

Lynds, L. and Weinberger, B.R.,"Pulsed Laser Ablation as a Source of Energetic Reactants: Synthesis of Superconducting High to Thin Films," Mat. Res. Soc. Symp. Proc. vol., 191, pp. 3–10.

Doll, Gary L., Sell, Jeffrey A., Salamanca–Riba, L. and Ballal, Ashwin K., "Laser Deposited Cubic Boron Nitride Films," Mat. Res. Soc. Symp. Proc. vol. 191. ©1990 Materials Research Society, pp. 55–60.

Erington, K.B. and Ianno, N.J., "Thin Films of Uniform Thickness by Pulsed Laser Deposition," Mat. Rs. Soc. Symp. Proc. vol. 191. ©1990 Materials Research Society, pp. 115–120.

*Primary Examiner*—Roy V. King

[57] ABSTRACT

This invention relates to a method of altering the electrical characteristics of a material through a laser ablation process. It can achieve high doping levels and shallow junctions at low temperatures, which are desirable in the fabrication of thin film transistors.

11 Claims, 19 Drawing Sheets

PROXIMITY LASER DOPING TECHNIQUE FOR ELECTRONIC MATERIALS

CROSS REFERENCES TO RELATED APPLICATIONS

This application is related to commonly assigned, concurrently filed U.S. patent application Ser. No. 08/655,515, filed May 30, 1996 by Mei et al. on "Deposition of Thin Films Using Laser Ablation", now abandoned.

FIELD OF INVENTION

The present invention relates generally to a method of altering the electrical characteristics of electronic materials such as semiconductors and superconductors. More specifically, the invention relates to the use of a laser source to selectively dope an electronic material at low temperatures.

BACKGROUND OF INVENTION

Thin film silicon technology has been widely used in large-area high-resolution liquid crystal display panels ("LCDs") and 2-dimensional image sensor arrays, both of which have a similar matrix of pixels. Generally, the pixels are defined by the intersection of metal lines which are connected to the gate and drain of a thin film transistor ("TFT"). When a voltage pulse is applied to the gate lines, electrical charge is transferred from the pixels to the output lines or vice versa. In an LCD, each pixel contains a TFT and a capacitor which causes the liquid crystal molecules to rotate when the capacitor is charged. In a sensor array, each pixel contains a TFT and an amorphous silicon p-i-n diode which stores electrical charges created by light and outputs the charges to an external read-out electronics when the TFT is switched on. The ability to fabricate smaller and faster TFTs is a key element in improving the resolution and the response time of large-area displays or sensors.

In order to make faster and smaller TFTs, it is necessary to form shallow and highly doped regions under the source and drain electrodes of a TFT. Shallow and highly-doped source and drain regions produce smaller device geometry, lower contact resistance, and lower junction capacitance, all of which in turn result in higher aperture ratio and better response time.

A commonly used technique to dope a semiconductor material is by ion implantation, which generally requires the use of toxic gases such as $BF_3$ and $PF_5$. Not only is this process potentially hazardous to the environment, it also creates substantial damage in the lattice of the semiconductor material. In order to remove the damage created by the implanted ions, the semiconductor material often has to undergo a long annealing cycle at high temperatures generally in excess of 600° C. Such an annealing process makes it difficult to form shallow junctions and highly doped regions because of diffusion. Worse yet, certain types of dopants such as boron, tend to create deep junctions when implanted because of so-called "channeling effects" even in the absence of a high temperature annealing step.

In addition to the difficulty in forming shallow junctions, ion implantation is ill-suited to the fabrication of large-area displays and sensors because they are typically fabricated on glass substrates, whose structural integrity and stability deteriorate at high temperatures. Hence, it is important to develop a process which does not subject such substrates to high temperatures. Furthermore, the implantation process currently limits the size of the substrates on which devices and circuits can be built. There is very limited availability of commercial ion implantation equipment that can be used for substrates larger than ten to eleven inches in size. Therefore, in order to achieve shallow junctions and high doping levels in TFTs, extensive efforts have been expended to develop a low temperature doping process of at least below 600° C. by using lasers.

One approach is generally known as gas immersion laser doping ("GILD"). An example of this approach is described in "Ultra-Shallow High-Concentration Boron Profiles for CMOS Processing," IEEE Electron Device Letters, vol. EDL-6, No. 6, June 1985. Under this approach, a semiconductor sample is placed in a reaction chamber into which dopants in their gaseous form such as $BF_3$ and $PF_5$ are introduced. Then, a pulsed excimer laser is used to irradiate the sample. The energy of the laser breaks the gas molecules and melts a thin layer of the semiconductor materials. The molecules that have sufficient kinetic energy are then absorbed by the molten semiconductor. Thus, the doping efficiency of this method depends upon the amount of dopants being absorbed by the molten semiconductor materials.

Under this approach, the substrate of the sample stays at low temperatures because each laser pulse lasts for only about 30 to 50 ns, which is only sufficient to melt approximately a few monolayers of materials. Because of the short duration, very shallow junctions can be achieved. However, since the incorporation of the dopants is limited by the equilibrium surface absorption rate at a given temperature, it is very difficult to achieve high doping levels. In order to increase the doping level, the sample needs to be irradiated by multiple pulses, which would adversely impact the throughput of this process. In other words, it is difficult for such a process to achieve high doping.

Another approach is to use a solid source such as one described in "In Situ Crystallization and Doping of a-Si Film by Means of Spin-On Glass" MRS Symposium Proceedings, vol 345, p. 59–64, 1994. Under this approach, a film transparent to lasers such as phosphorus-doped spin-on-glass ("SOG") is first spun onto the sample. When the laser irradiates the sample with the SOG, the sample is heated up to an adequately high temperature so that the dopants in the SOG can diffuse into the sample. However, since the SOG film is transparent, no absorption of laser energy by the SOG itself occurs. The approach is limited by the solid solubility limit of the dopants in the material, which again results in low doping levels. Besides low doping efficiency, another disadvantage is the difficulty associated with removing the solid doping source on the semiconductor sample. Often, the laser alters the interface between the doping source and the underlying material, damaging the surface of the underlying material when the doping source is removed.

Recently, an approach which can produce relatively high doping efficiency using lasers was set forth in "Low Temperature Fabrication of Poly-Silicon TFT's Using In-Situ Chemically Cleaning Method," Material Research Society Symposium, v. 283, p0. 629–634 (1993). Under this approach, a doped amorphous silicon layer, which is not transparent to lasers, is deposited by a method known as plasma enhanced chemical vapor deposition ("PECVD"). A laser is then used to melt and recrystallize the doped amorphous silicon film, resulting in relatively shallow and highly doped regions. However, this process does not resolve the problem associated with the subsequent removal of the deposited material. It is very difficult to selectively remove the doped amorphous silicon layer, which typically responds to etchants in a manner which is similar to that of the underlying semiconductor material.

BRIEF SUMMARY OF INVENTION

The present invention provides a technique which takes advantage of the low temperature nature of laser processing but also produces shallow junctions and high dopings. This process utilizes laser ablation to generate relatively energetic atoms to dope semiconductor materials. An article describing the chemistry and physics behind laser ablation is entitled "Pulsed Laser Ablation As A Source of Energetic Reactants: Synthesis of Superconductors and Thin Films," Material Research Society Symposium Proceeding, vol. 191, pp. 3–10 (1990).

This invention utilizes a rapid interaction between a laser pulse and a non-transparent thin source film deposited on a transparent plate, which is placed in close proximity to a substrate. When the non-transparent source film is irradiated, it absorbs the laser energy and generates a large number of energetic chemical radicals. At the same time, a thin surface layer of the substrate material is melted by the laser. Because of the energy associated with the chemical radicals generated by laser ablation, they are more effectively absorbed by the semiconductor materials. When applying this technique to doping semiconductor, not only does this invention achieve low temperature processing and shallow junctions, it can produce high doping levels with minimal additional processing complexity. This ability to create shallow junctions and high doping levels allows the formation of TFTs with lower resistance and capacitance so that high-density and large-area displays can be made.

Another advantage of this invention is that the source film on the transparent plate may be pre-patterned and may be n- or p-type, so that the doping pattern can be directly transferred to the semiconductor sample. This feature replaces the need for photolithographic processing which requires expensive optical projection equipment. Also, after the processing, the source plate can be reused or recycled for other purposes.

Still another advantage of this invention is that no toxic gases such as $BF_3$ and $BP_5$ are required. Accordingly, there is no need for a special gas chamber for this process. The process can be performed without a high vacuum chamber.

Yet another advantage of this invention is that it allows low temperature deposition of thin films onto a large area substrate. This technique is particularly useful in depositing films on materials which tend to deteriorate at high temperatures. This invention also allows selective deposition of thin films onto a substrate.

The above advantages such as low substrate temperature, shallow junctions, selective deposition, and large-area processing compatibility, enable a broad application of this invention. The advantages and objects of the present invention will become apparent to those skilled in the art from the following detailed description of the invention, its preferred embodiments, the accompanying drawings, and the appended claims.

DETAILED DESCRIPTION OF PREFERRED EMBODIMENTS

Figure 1:
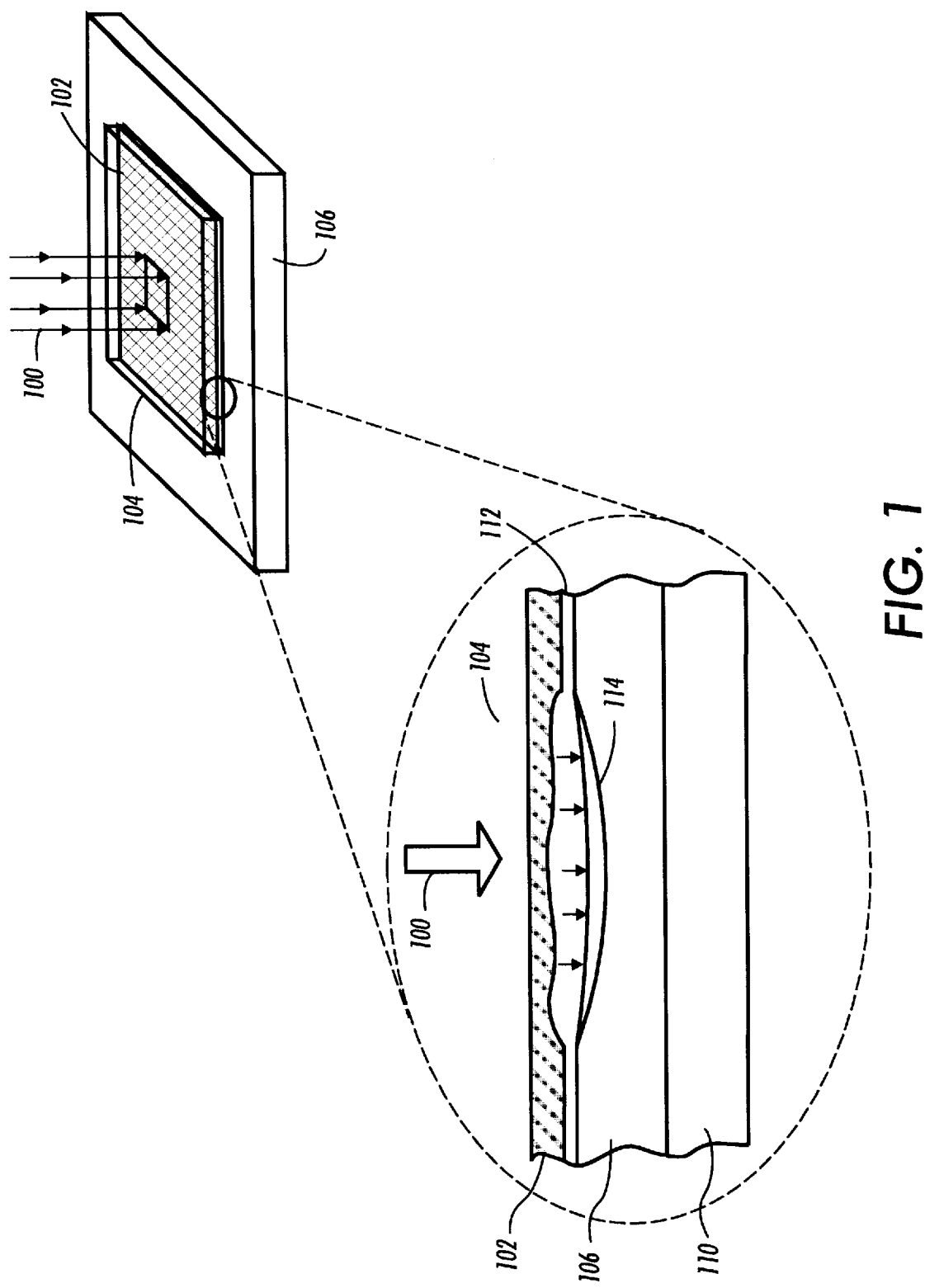
FIG. 1 illustrates the application of proximity laser doping to a material.

FIG. 1 illustrates the preferred embodiment of the present invention. It illustrates the application of proximity laser doping to an electronic material such as a semiconductor sample. This proximity doping system comprises a laser source 100, a source film 102, a source plate 104, and a semiconductor sample 106, in which a doped region is to be formed. A suitable laser source is a pulsed excimer laser such as XeCl, KrF, or ArF. A YaG laser may also be used.

Figure 2:
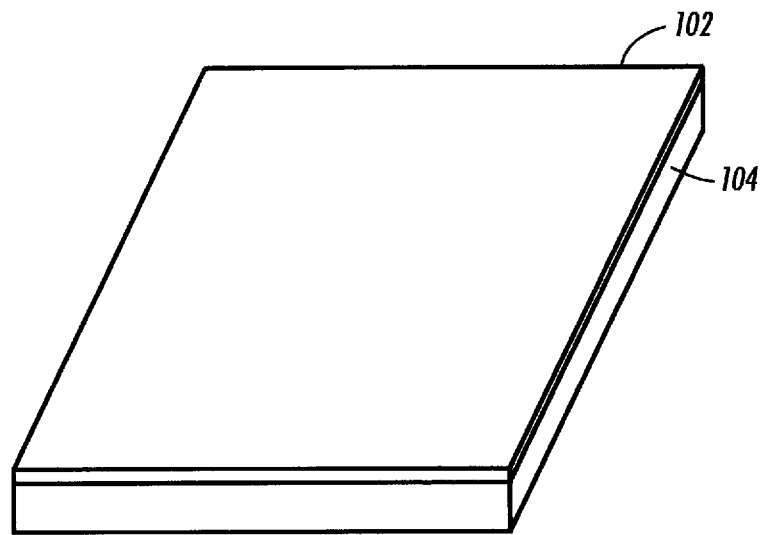
FIG. 2 illustrates a source plate with a deposited source film.

In this embodiment, the source film 102, which is made of a material that is not transparent to lasers, is deposited on the source plate 104 as shown in FIG. 2. The source plate is typically made of a material transparent to lasers such as glass or quartz. The chemical composition of the source film depends on the specific application. A PSi alloy is generally used to form n-type doping in silicon while a BSi is often used to form p-type doping. If the present invention is applied to other electronic materials such as III–V compound semiconductors or superconducting materials, the source film would be of a different chemical composition. For instance, in order to dope GaAs or a superconducting material such as $YBa_2Cu_3O_7$ with this technique, a silicon film may be used.

Figure 3:
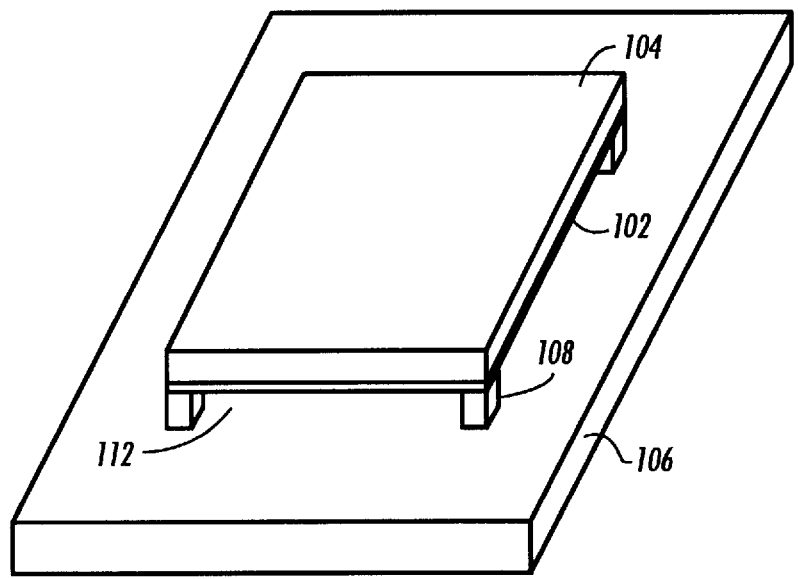
FIG. 3 illustrates a source film in proximity to a semiconductor sample.

As shown in FIG. 3, the source plate 104 with a deposited source film 102 is placed face down in close proximity to the semiconductor sample 106. The gap 112 between the source film 102 and the semiconductor sample 106 ranges from zero to several millimeters. A typical gap is several microns. The size of this gap is determined by the height of spacers 108. Generally, the smaller the gap between the source film and the sample, the larger the amount of dopants that would be absorbed into the semiconductor sample.

After the sample 106 has been placed in close proximity to the source film 102, the laser irradiates through the source plate 104 onto an area of the source film 102 as shown in FIG. 1. After the laser energy travels through the transparent source plate 104, it is absorbed by the source film 102. During this process, the laser pulse ablates the source film 102, releasing energetic dopants into the gap between the source film 102 and the sample 106 as well as into the sample 106. These chemical radicals may have kinetic energy of approximately 100 eV.

In addition to ablating the source film 102, the laser energy also melts the surface region 114 of the sample 106 as shown in FIG. 1. The depth of the region that is melted by the laser typically depends upon the laser energy and the pulse width as well as the thermal transport properties of the sample 106. Typically, the pulse width of a laser pulse is approximately 50 nanoseconds. When the dopants come in contact with the molten region of the sample, the dopants are incorporated into the sample. The dopants are activated when the material is solidified again. The amount of dopants incorporated in the sample depends upon the laser energy and the gap between the source plate and the sample.

Figure 4A:
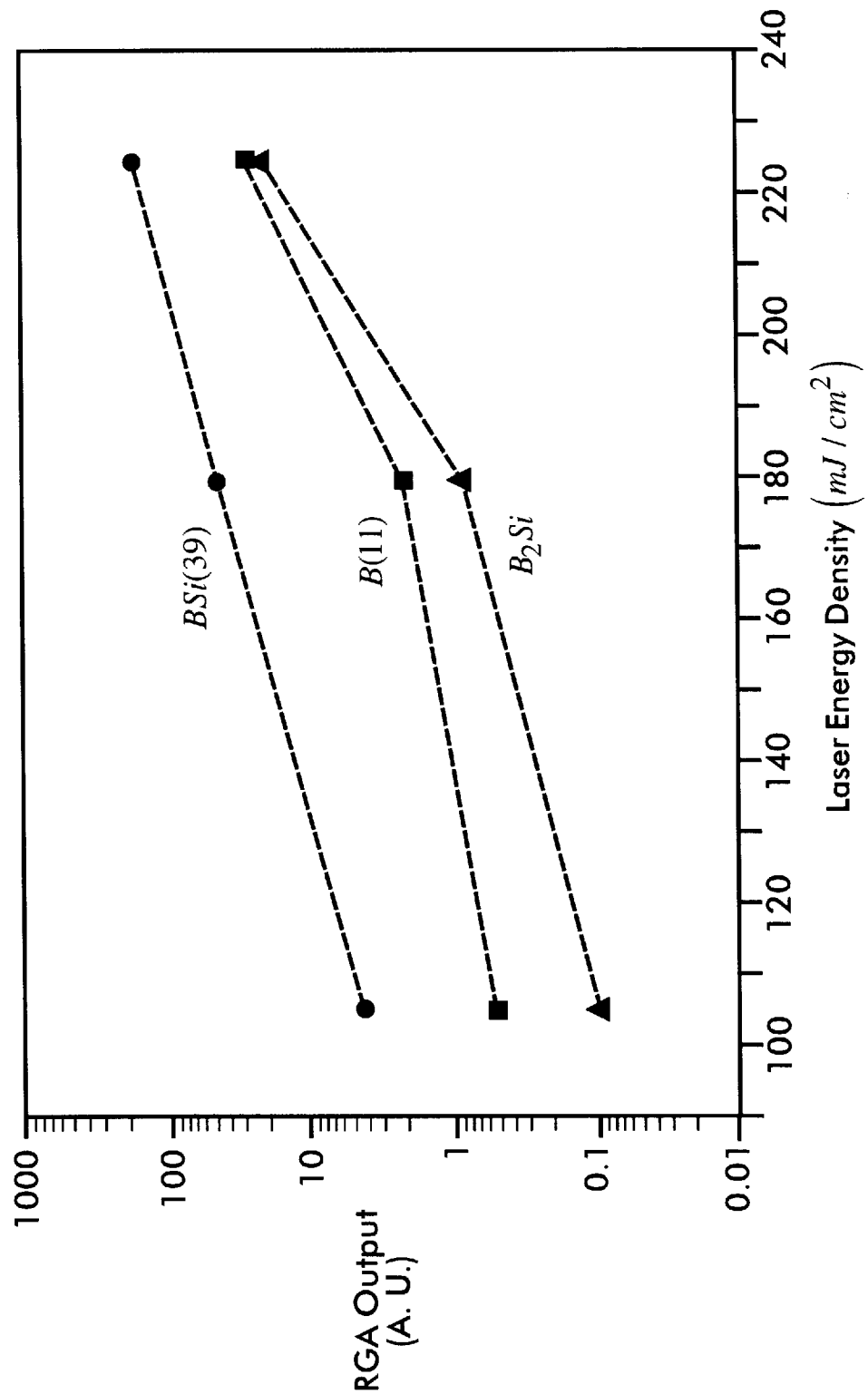
FIG. 4 (a) shows the type and amount of dopants produced by a B—Si film.
FIG. 4(b) shows the type and amount of dopants produced by a P—Si film.
Figure 4B:
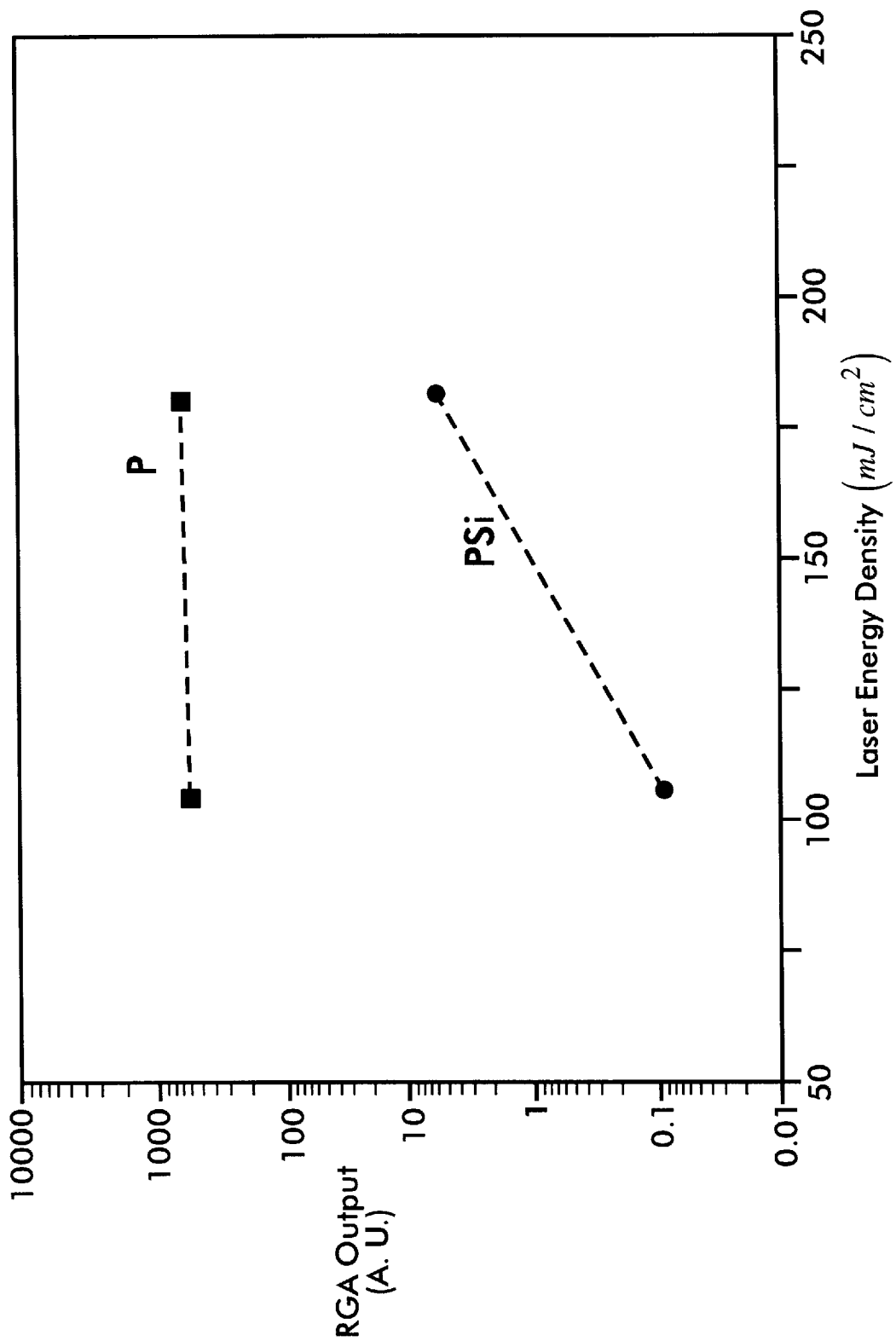
Figure 5A:
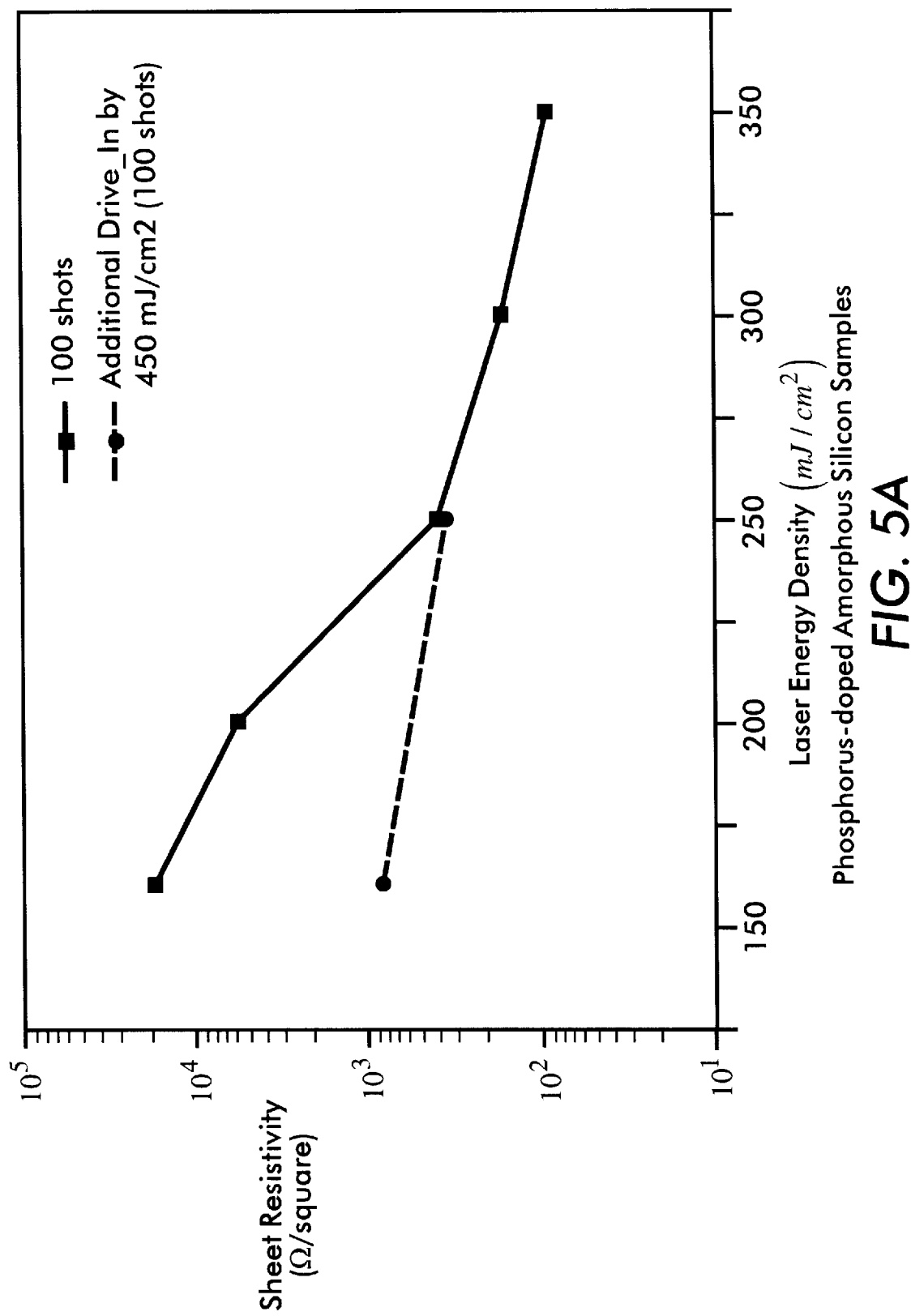
FIG. 5(a) shows the sheet resistivity as a function of laser energy density in phosphorus-doped amorphous silicon ("a-Si") samples.
Figure 5B:
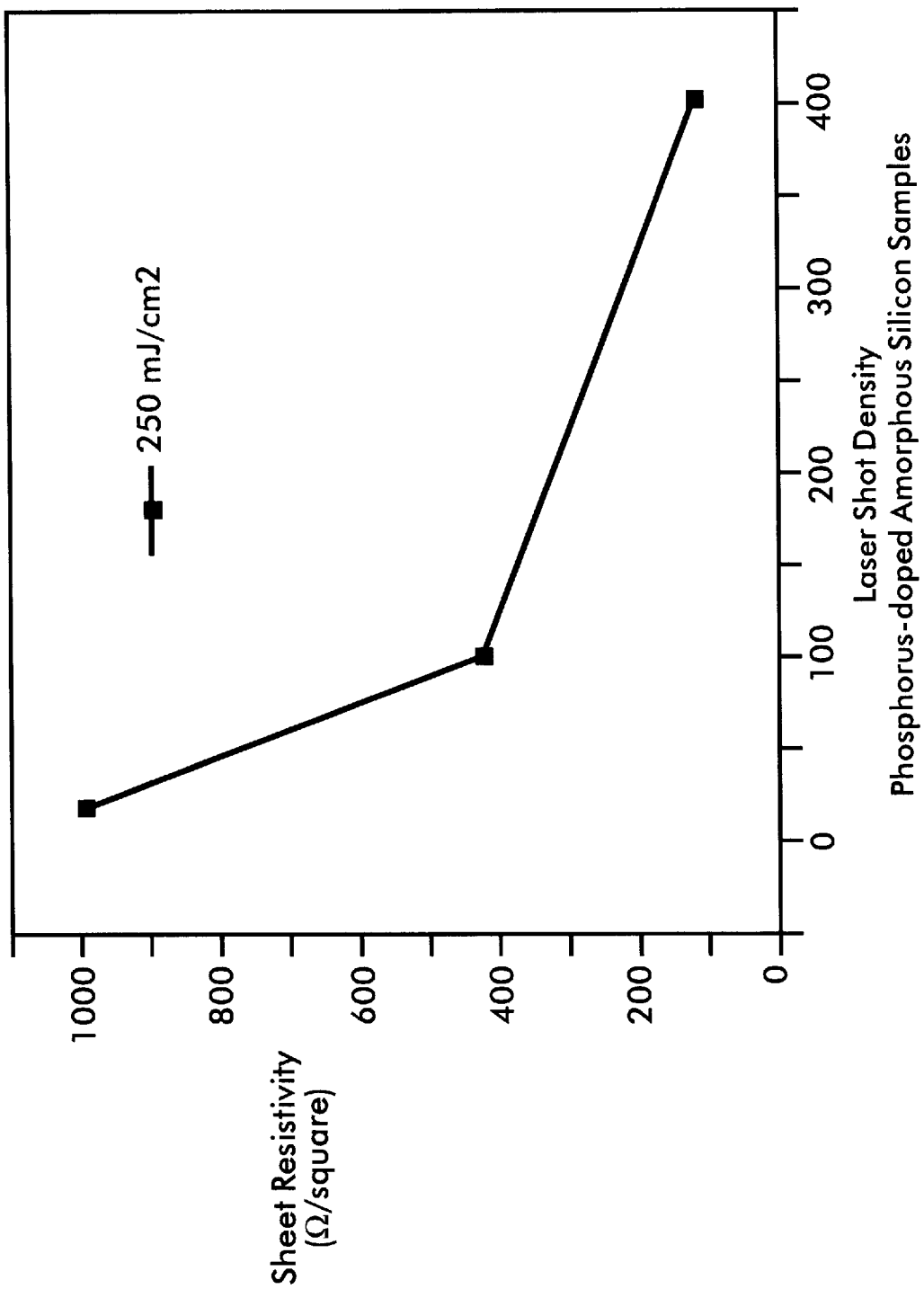
FIGS. 5(b) shows the sheet resistivity as a function of laser shot density in phosphorus-doped amorphous silicon samples.
Figure 5C:
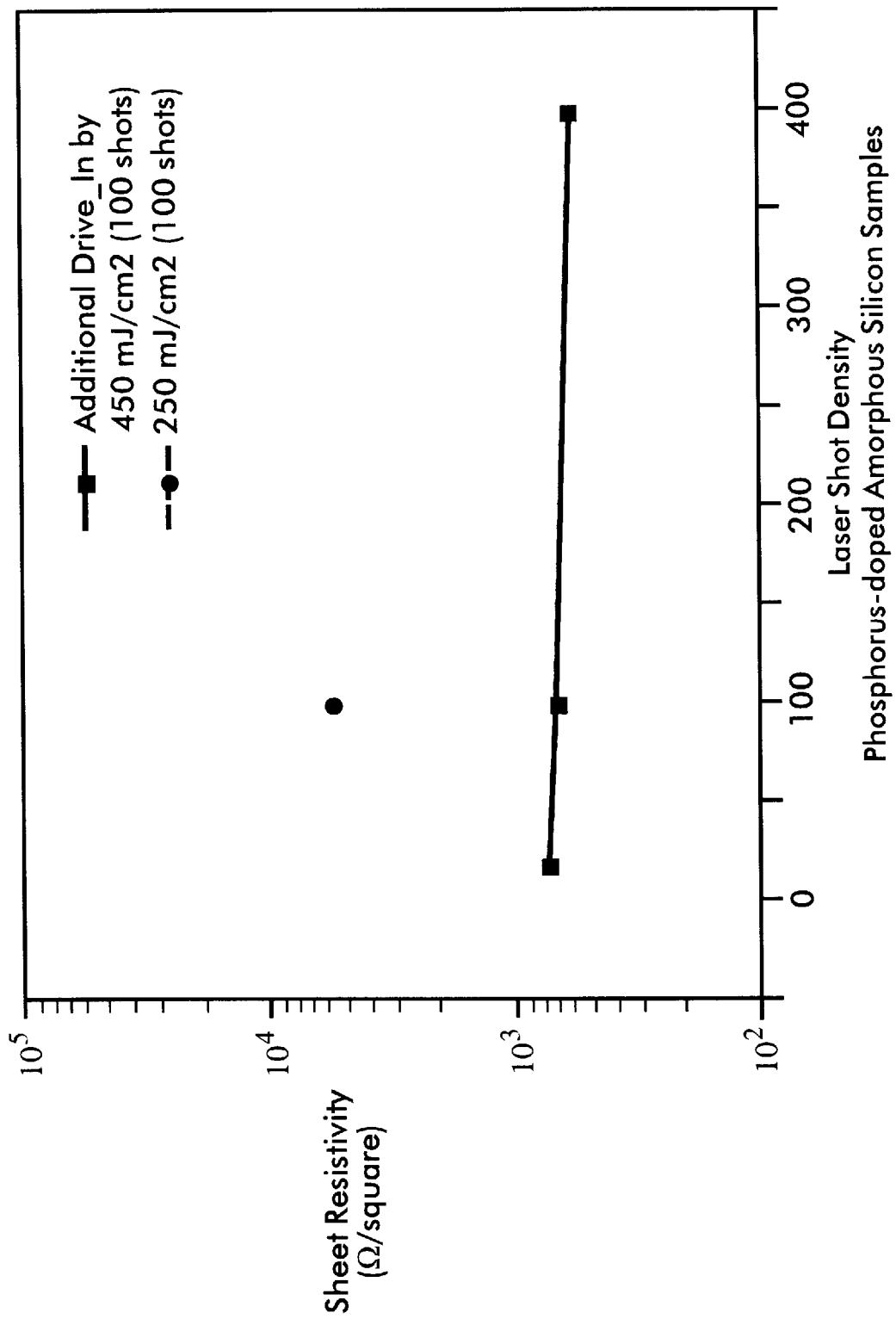
FIG. 5(c) shows the sheet resistivity of phosphorus-doped amorphous silicon samples as a function of the laser shot density. The round data point represents the sample which underwent a doping process of 100 shots at 200 $mJ/cm^2$ while the square dots represent samples which underwent an additional drive-in step of 450 $mJ/cm^2$ at various shot density.
Figure 5D:
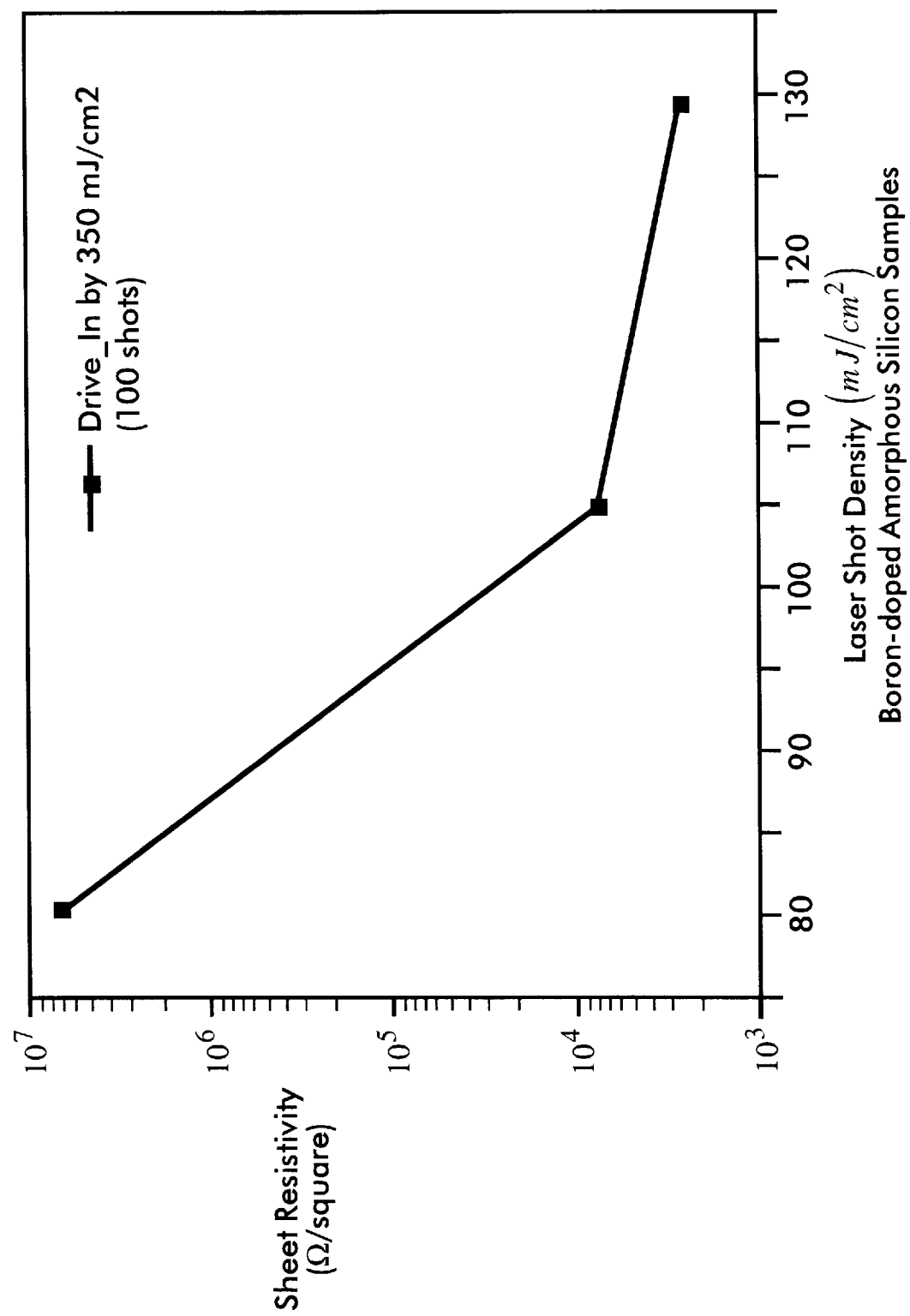
FIG. 5(d) shows the sheet resistivity of boron-doped amorphous silicon samples as a function of 100 shots of various laser energy density. In addition to the doping process, all samples also underwent an additional drive-in step of 100 shots at 350 $mJ/cm^2$.
Figure 6A:
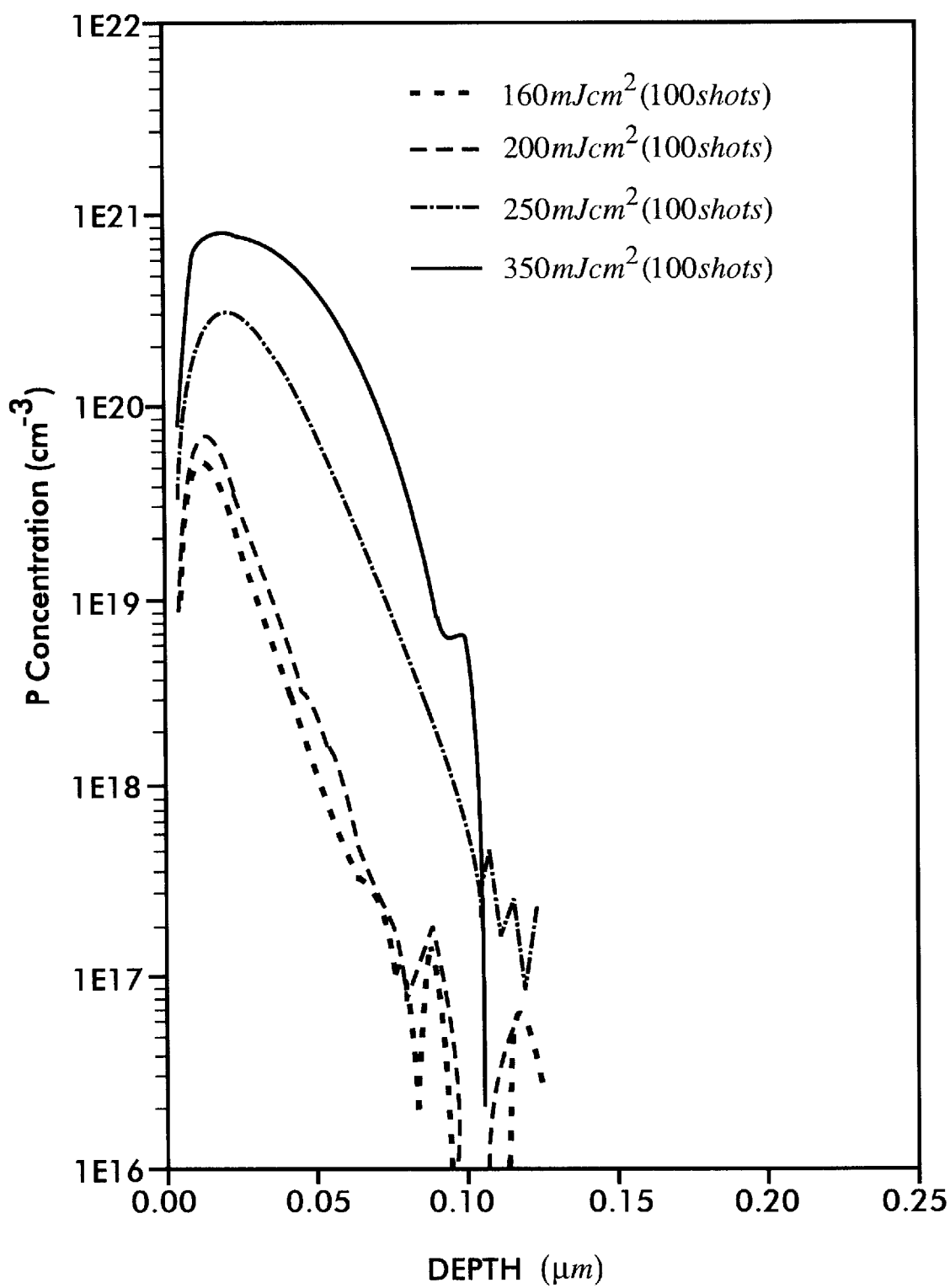
FIG. 6(a) shows the depth and doping level of phosphorus in a silicon sample doped by a pulsed laser at different laser energy density.
Figure 6B:
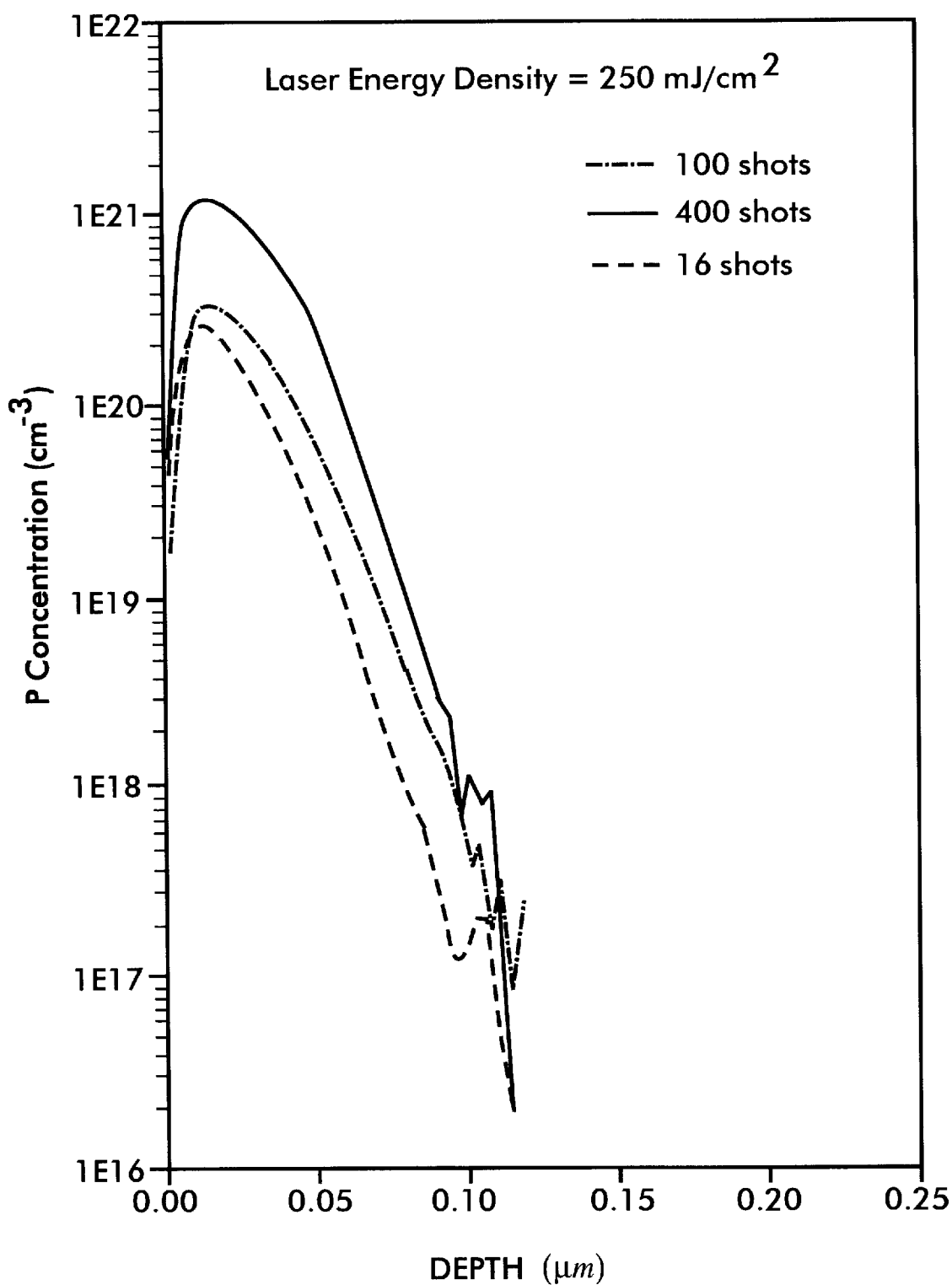
FIG. 6(b) shows the depth and doping level of phosphorus in a silicon sample doped by a pulsed laser at different laser shot density.
Figure 6C:
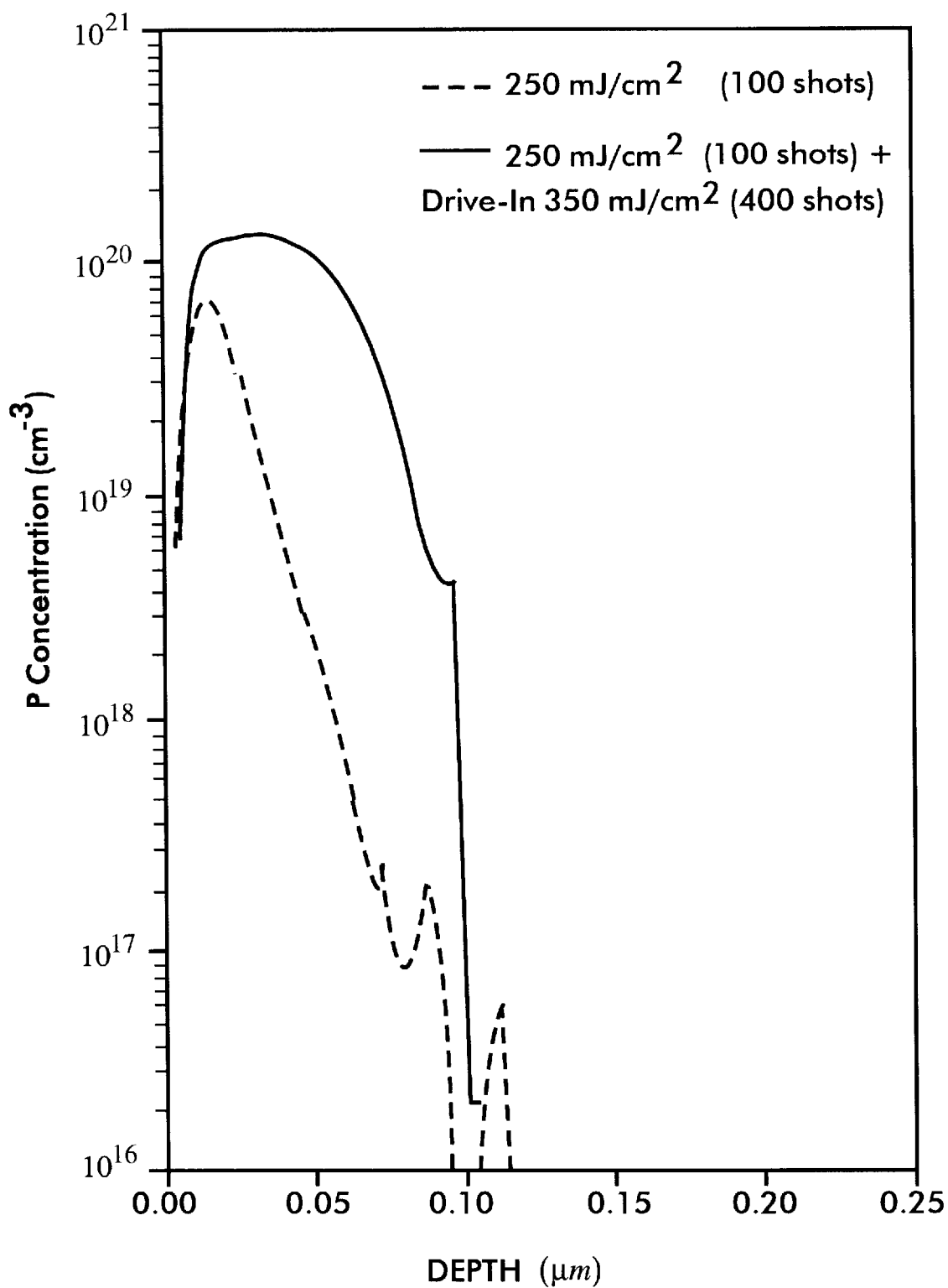
FIG. 6(c) shows the depth and doping level of phosphorus in silicon samples doped by a pulsed laser of 100 shots at 250 $mJ/cm^2$. The dashed line represents the sample which underwent an additional drive-in step of 400 shots at 350 $mJ/cm^2$.
Figure 6D:
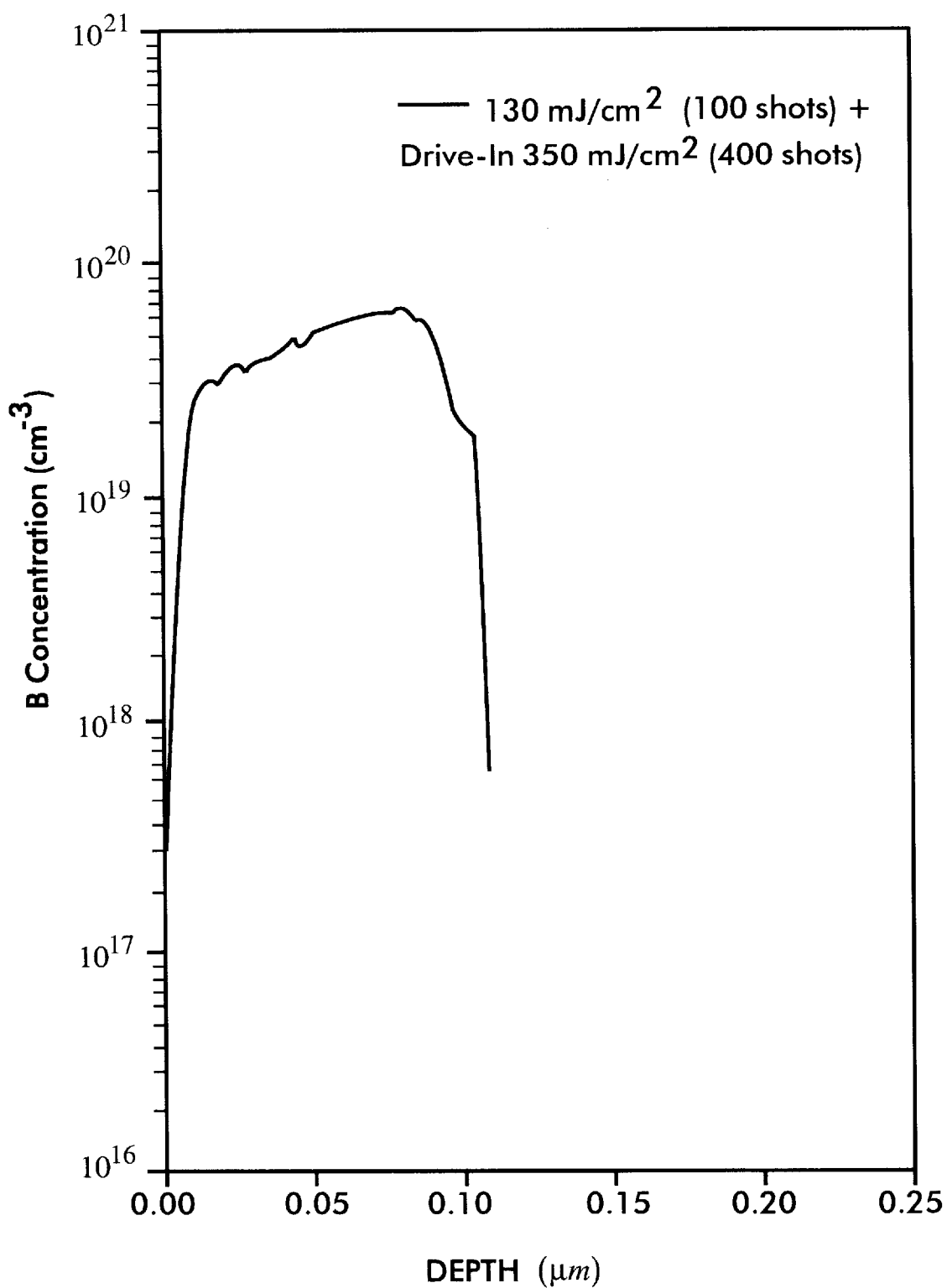
FIG. 6(d) shows the depth and doping profile of boron in a silicon sample after a drive-in step.
Figure 6E:
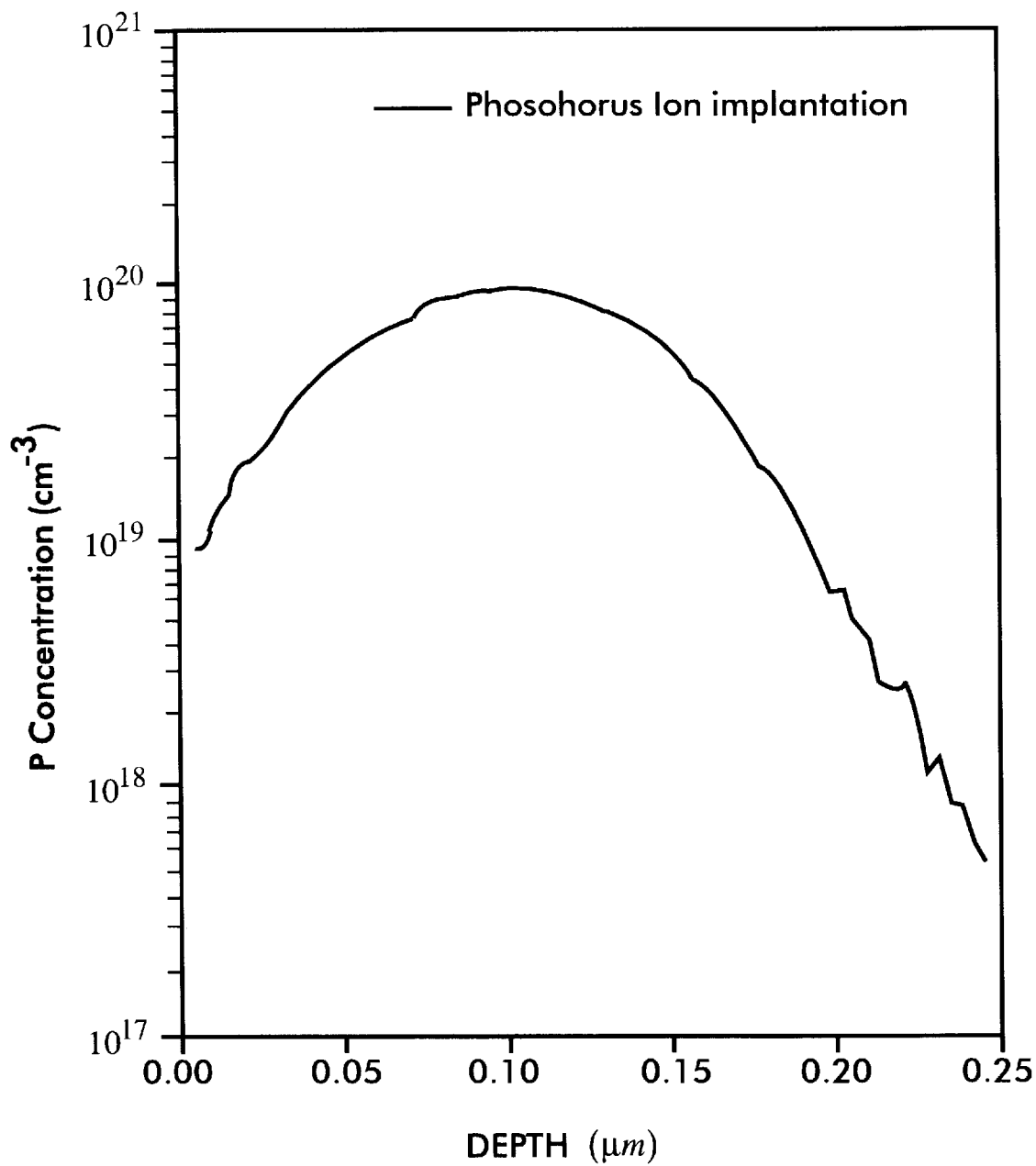
FIG. 6(e) shows the doping profile of a silicon sample doped by a conventional ion implantation process with a phosphorus dose of $10^{15}$ $cm^{-2}$.
Figure 6F:
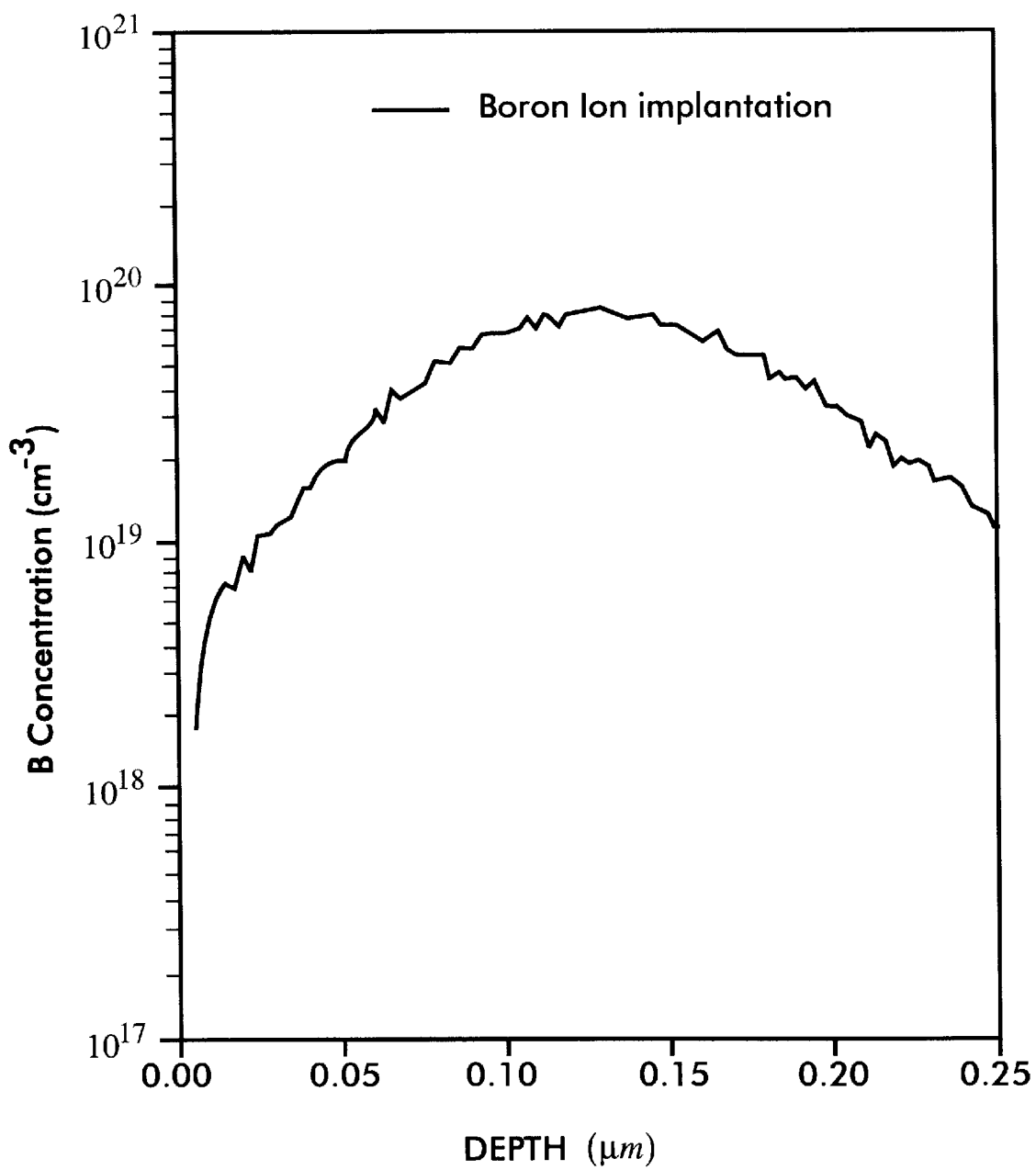
FIG. 6(f) shows the doping profile of a silicon sample doped by a conventional ion implantation process with a boron dose of $10^{15}$ $cm^{-2}$.

FIGS. 4(*a*) and (*b*) show the measurement results of a residual gas analysis ("RGA") performed on the primary chemical radicals ablated from a BSi alloy and a PSi alloy as functions of the laser energy. When a pulsed laser ablates a BSi film, the primary chemical radicals are BSi(39), B(11), and $B_2Si$ whereas when a laser ablates a PSi film, the chemical radicals are mostly P and PSi. Generally, the ablation energy threshold for PSi film is much lower than that of BSi, producing more efficient n-type doping. As discussed previously, the doping level in the sample depends upon factors such as laser energy density and laser shot density. In order to achieve low resistance in devices, a high doping level must be attained.

FIGS. 5 (*a*) and (*b*) show the sheet resistivity of phosphorus-doped amorphous silicon samples as a function of the laser energy density and shot density respectively. The solid line connects the data points from samples which underwent a 100 shots of laser pulses at various laser energy densities. The dashed line connects the data points from samples which underwent an additional drive-in step of 100 shots at 450 mJ/cm². As shown in FIG. 5(*a*), a sheet resistivity as low as about 1 kΩ/square can be achieved by using an initial doping process of 100 shots at approximately 150 mJ/cm², followed by a separate drive-in process of 100 shots at a laser density of 450 mJ/cm². Generally, as indicated by the solid line in FIG. 5(*a*), lower sheet resistivities can be achieved by using higher laser energy densities during the doping process. The sheet resistivities of the samples can also be further reduced by the use of an additional drive-in as shown by the dashed line in FIG. 5(*a*). Likewise, FIG. 5(*b*) shows a sheet resistivity below 1 kΩ/square can be achieved by a laser doping process of 16 shots from a laser source of 250 mJ/cm².

FIG. 5(*c*) shows the sheet resistivity of phosphorus-doped amorphous silicon samples as a function of laser shot density. All samples in FIG. 5(*c*) were irradiated with 100 shots of a laser source which has a fluence of 200 mJ/cm². Data points represented by square dots then underwent an additional drive-in step of 450 mJ/cm² at various laser shot density. As shown by FIG. 5(*c*), a drive-in step reduces the sheet resistivity by one order of magnitude.

FIG. 5(*d*) shows the sheet resistivity of boron-doped amorphous silicon samples as a function of 100 shots of various laser energy density. All samples in FIG. 5(*d*) were irradiated with 100 shots of a laser source at various energy density. The samples then underwent an additional drive-in step of 100 shots at 350 mJ/cm². A sheet resistivity of al low as about 2 kΩ/square was obtained by a proximity laser doping process of 100 shots at 130 mJ/cm², which was followed by a drive-in step of 100 shots at 350 mJ/cm². These results represent an improvement over the sheet resistivities obtained by a typical ion implantation process. The doping efficiency for boron can be further improved by lowering the BSi film ablation energy, which can be achieved by modifying the chemical composition and density of the source film.

FIGS. 6(*a*) through 6(*f*) show the results of secondary ion mass spectroscopy ("SIMS") measurements which show the depth of phosphorus and boron dopants in silicon samples. Specifically, FIG. 6(*a*) shows the depths and profiles of phosphorus dopants in a silicon sample doped by 100 shots of a pulsed laser at different laser energy densities. Likewise, FIG. 6(*b*) shows the depth and profile of phosphorus dopants in a silicon sample doped by a pulsed laser of 250 mJ/cm² and a laser shot density ranging from 16 to 400 shots.

FIG. 6(*c*) shows the depth and doping level of phosphorus in a silicon sample doped by a pulsed laser at different laser energy density and different laser shot density. The dashed line represents the doping profile of a sample which has undergone 100 shots of a pulsed laser at 250 mJ/cm². The solid line represents a sample which has undergone an additional drive-in process of 400 shots at 350 mJ/cm². FIG. 6(*d*) shows the doping profile of boron in a silicon sample which has undergone 100 shots of pulsed laser at 130 mJ/cm² and a drive-in step of 100 shots at 350 mJ/cm². As shown by FIGS. 6(*a*) through (*d*), both doping level and depth increase by increasing the laser energy density and the shot density.

On the other hand, FIGS. 6(*e*) and 6(*f*) show the doping profile of silicon samples doped by a conventional ion implantation process with a dose of $10^{15}$ cm$^{-2}$. Specifically, FIG. 6(*e*) shows the doping profile of a silicon sample implanted with phosphorus whereas FIG. 6(*f*) shows the doping profile of a silicon sample implanted with boron. Both FIGS. 6(e) and 6(f) show that ion implantation produces deeper junction depths than that of proximity laser doping. These results indicate that the proximity laser doping is a practical and efficient technique to form n- and p-type layers.

Other parameters which also determine the doping depth and level are the source film thickness and post-doping processing steps. A typical film thickness used in this embodiment is 10 nm, which is comparable to or less than the optical absorption depth of a typical excimer laser, so that some of the laser energy can reach the underlying sample and melt its surface. The uniformity of the doping can be further improved by employing repeated laser irradiations. Perhaps more importantly, this invention can be easily applied to large area device processing by scanning the laser beam across the sample in both x and y directions.

Figure 7A:
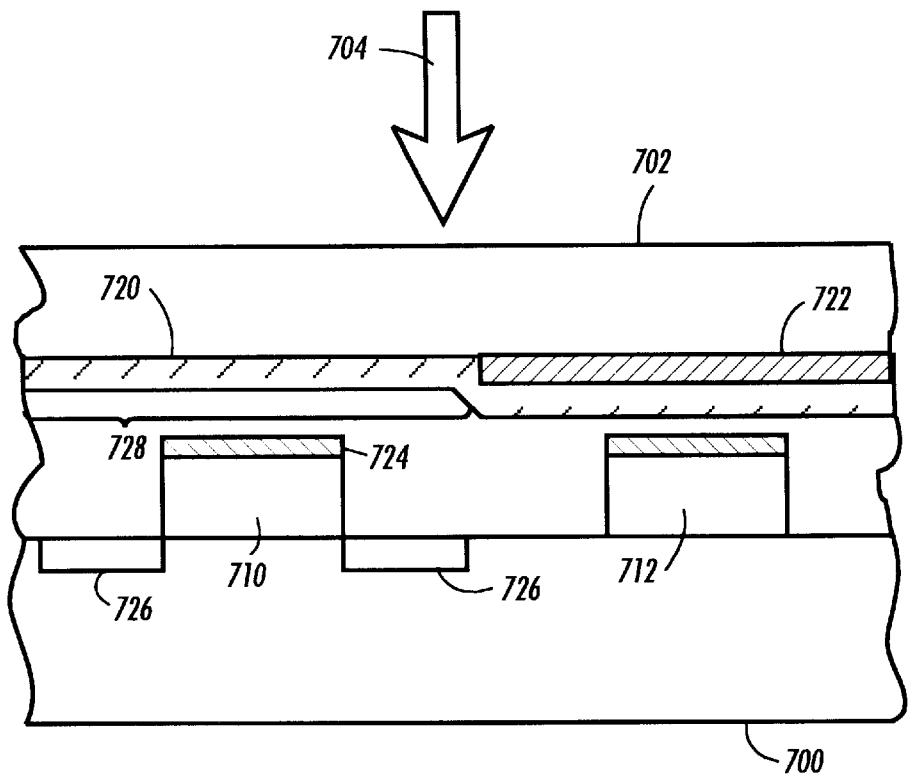
FIG. 7(a) illustrates an n-type TFT with source and drain regions doped by proximity laser doping.
Figure 7B:
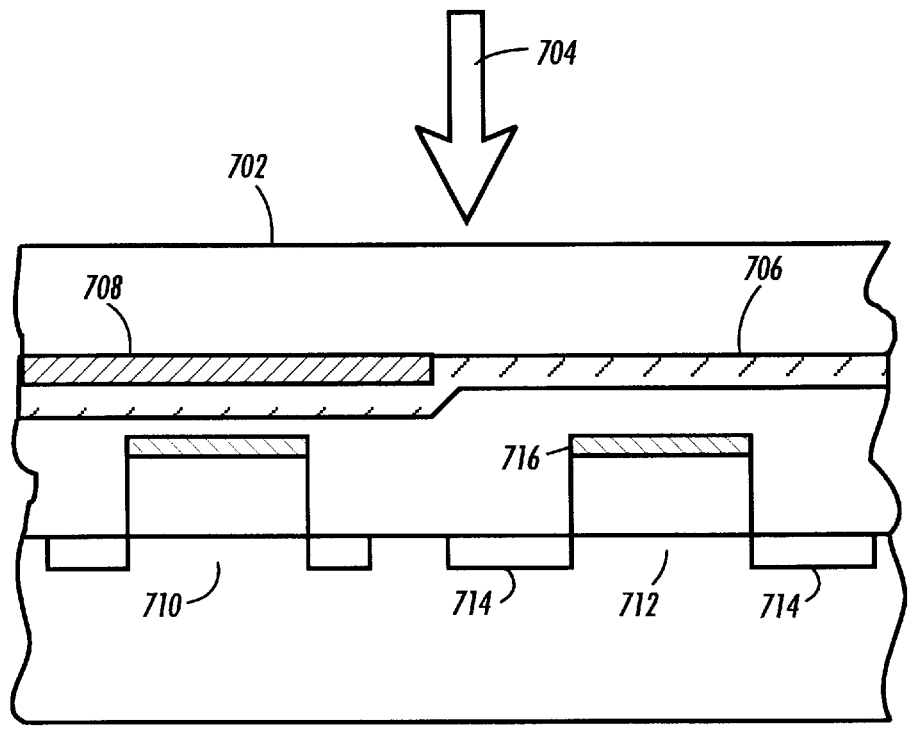
FIG. 7(b) illustrates a p-type TFT with source and drain regions doped by proximity laser doping.

The present invention can also be applied to the fabrication of CMOS transistors as shown in FIGS. 7(a) and 7(b). In FIG. 7(a), in order to pattern the silicon wafer 700, the n-type source plate 702 is masked by a metal film 722 such as Al, Cr, or TiW, which blocks laser transmission in selected areas. The locations of the regions doped by proximity laser technique are defined by the openings in the metal mask plates such as region 728. When laser 704 irradiates through the source plate 702, areas that are not protected by the metal mask allow the laser energy to ablate the source film, thereby doping the sample. In areas covered by metal mask 722, no photon transmission occurs and thus no doping results. In FIG. 7(a), the metal mask 722 protects the p-type TFT 712 while the laser dopes the source and drain regions 726 of the n-type transistor 710. The gate metal 724 masks the source and drain regions of the n-type TFT. Likewise, in FIG. 7(b), the metal mask 708 protects the n-type TFT 710 while the laser dopes the source and drain regions 714 of the p-type TFT 712. The gate metals 716 also masks the source and drain regions of the p-type TFT.

Figure 8:
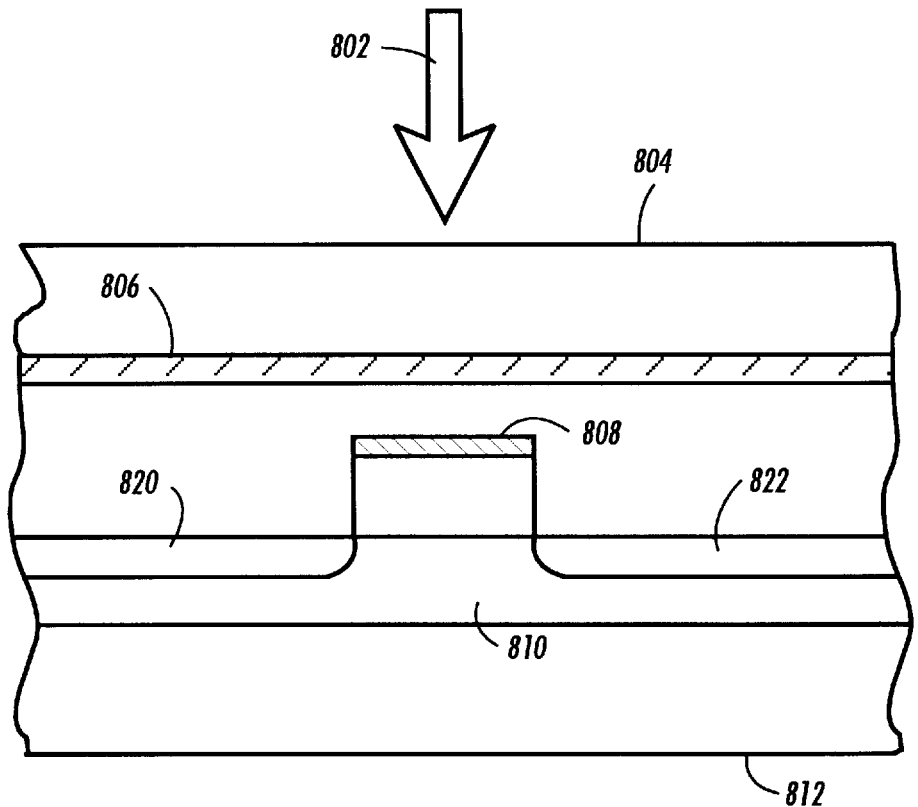
FIG. 8 illustrates a top-gate TFT with source and drain regions doped by proximity laser doping.

The present invention may also be applied to the fabrication of a top-gate polysilicon ("Poly-Si") TFT as shown in FIG. 8. FIG. 8 shows a laser 802 irradiating a thin source film 806 deposited on a source plate 804, which is placed in close proximity to the gate metal 808 of a transistor. When the laser irradiates the source film 806, the laser energy ablates the source film 806 causing energetic dopants to be incorporated into the source and drain regions, 820 and 822, in the polysilicon layer 810. By using the gate metal 808 as a mask, proximity laser doping could greatly simplify the fabrication process for a transistor, which typically requires the formation of doped regions around the gate electrode.

Figure 9:
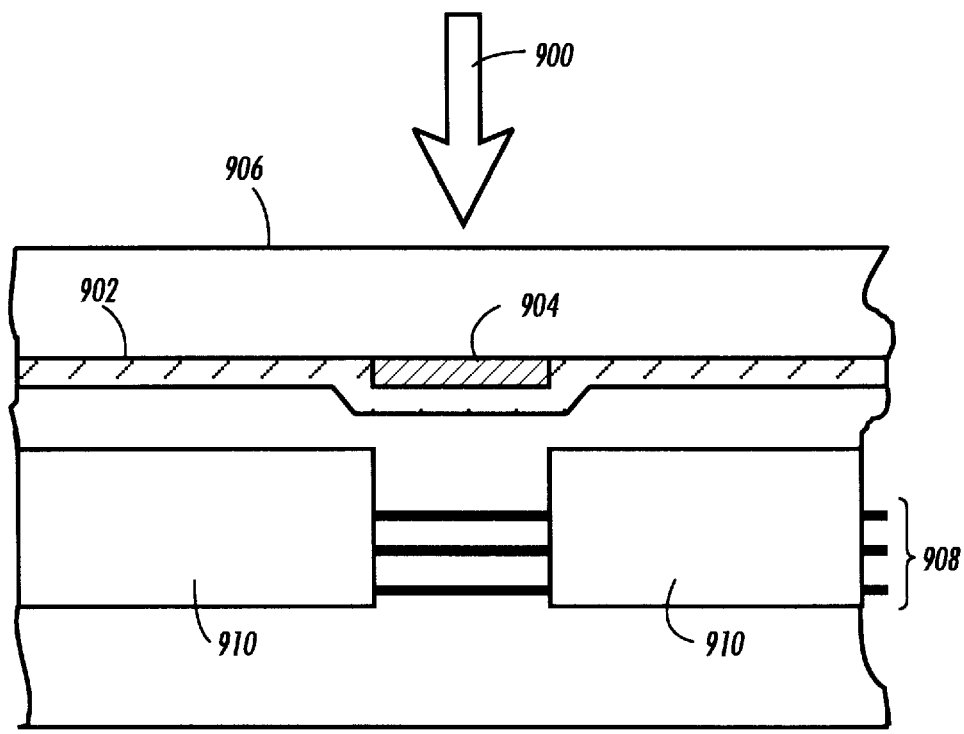
FIG. 9 illustrates the use of proximity laser doping to form optical and electrical confinement in GaAs/AlAs superlattice.

The present invention can also be applied to doping III–V semiconductor lasers, optical waveguides, and LED devices. FIG. 9 shows an example using proximity laser doping technique to form optical and electrical confinement in semiconductor lasers. The source film 902 is a thin silicon layer which is deposited over a metal mask 904 on a quartz source plate 906. A typical source film is amorphous silicon deposited by PECVD. The device structure in the semiconductor material 908 is a GaAs/AlAs superlattice. When the laser 900 ablates the source film 902, silicon atoms evaporated from the film and are incorporated into the unmasked regions 910, causing interdiffusion or disordering of Ga and Al atoms in those regions of the superlattice 908. Since AlAs has a wider bandgap and a smaller refractive index compared with GaAs, electrical and optical confinement can be achieved in regions 910 through the intermixing process. A similar process can be applied to InP/InGaAsP superlattices as well as other semiconductor materials such GaN, where conventional doping is difficult and inefficient.

Figure 10:
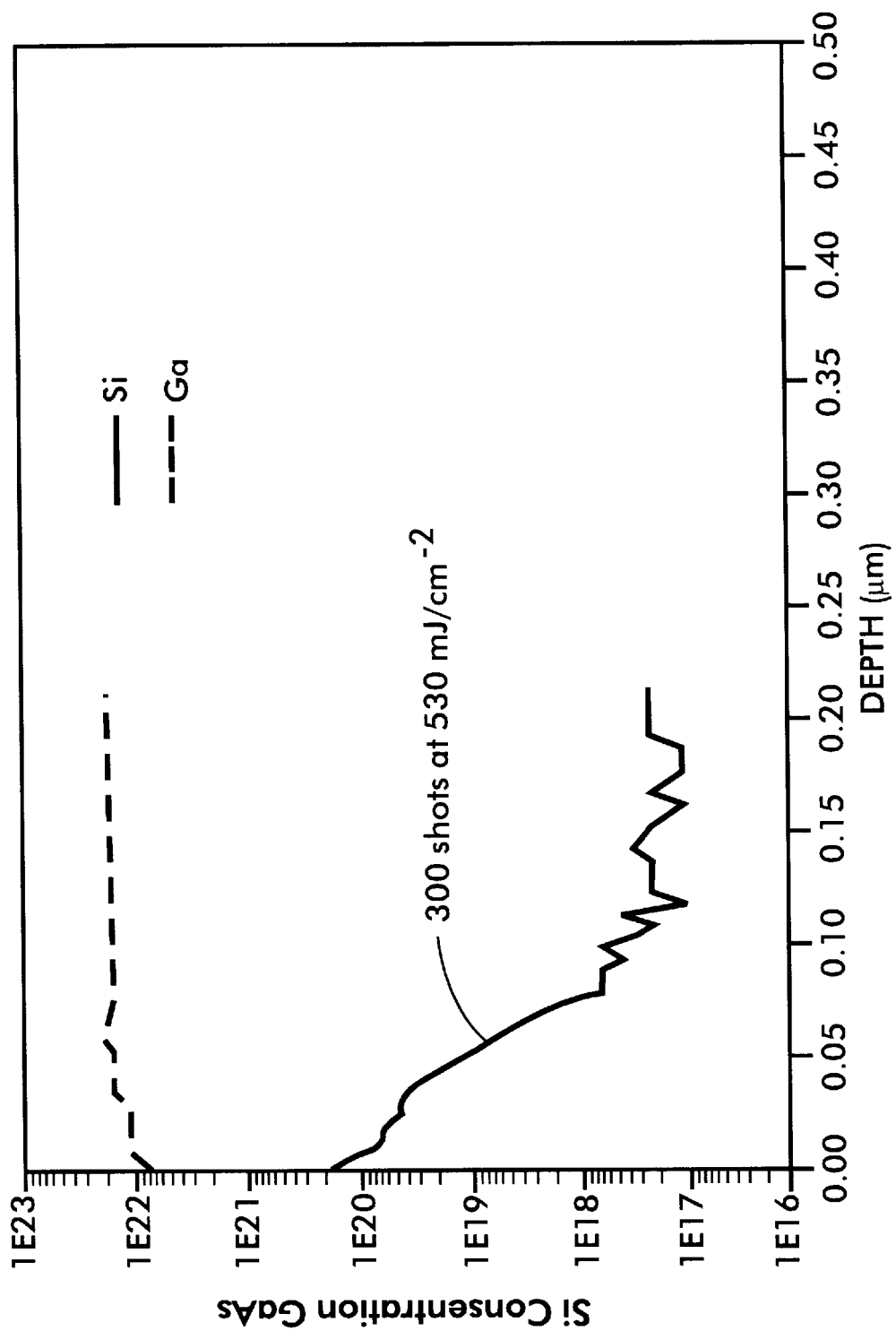
FIG. 10 shows the results of a secondary ion mass spectroscopy ("SIMS") which measure the depth and doping level of silicon introduced by proximity laser doping in an unintentionally doped intrinsic GaAs sample.

FIG. 10 shows the results of a SIMS measurement showing the depth and doping level of silicon in an unintentionally doped intrinsic GaAs sample. The solid line shows that three laser shots at a density of 530 mJ/cm$^2$ can produce a high silicon surface concentration of about $10^{20}$ cm$^{-3}$ and a junction depth of about 0.08 micron. The dashed line indicates the gallium concentration in the sample.

Another application of this present invention is to passivate semiconductors with hydrogen. For instance, amorphous silicon and SiN films deposited by a low temperature PECVD process contain a large amount of hydrogen, which can be used as a hydrogenation source for the proximity laser doping. A large amount of hydrogen can be generated by pulsed laser irradiation using a nitrogen-rich SiN film deposited by PECVD. The hydrogen atoms generated by this process can effectively passivate the defects in semiconductors such as amorphous or polycrystalline silicon wafers. In other words, this technique can be used to introduce hydrogen into silicon and passivate devices such as poly-Si TFTs.

Yet another application of this proximity laser ablation technique is the deposition of thin films. The present invention allows low temperature deposition of thin films over a large area substrate. It also enables patterned deposition of films onto a substrate material. This approach is particularly useful in depositing films on a material such as GaAs, which tends to deteriorate at high temperatures.

Figure 11:
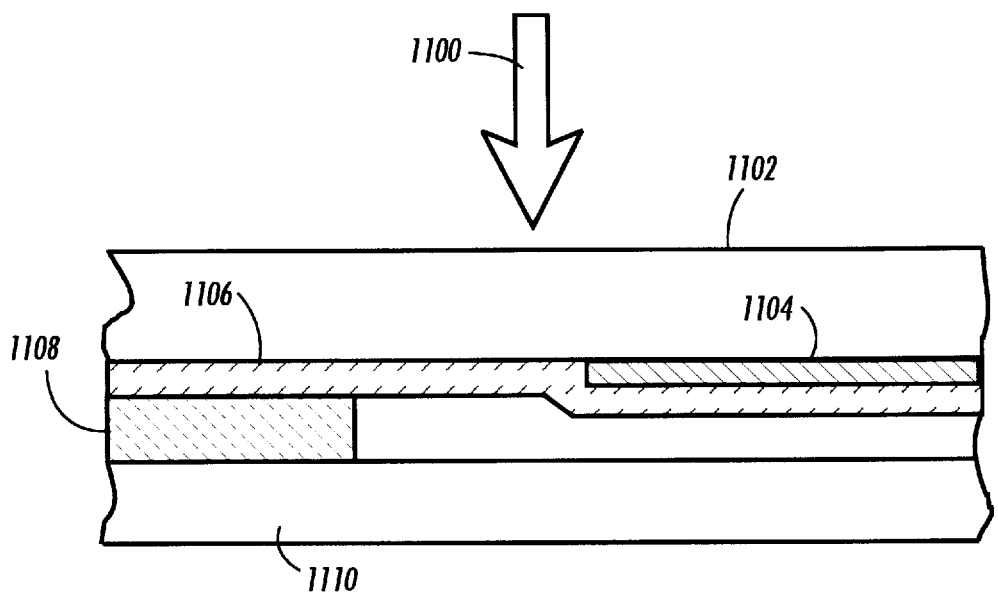
FIG. 11 illustrates the application of proximity laser ablation to the deposition of thin films.

FIG. 11 illustrates an arrangement for depositing a layer of silicon onto GaAs. As shown in FIG. 11, a silicon film 1106 is first deposited on a plate 1102 that is transparent to laser energy. This deposition step may be performed at high temperature since it does not affect the substrate material. The silicon film 1106 is then placed in close proximity to the GaAs substrate 1110. Then, the laser 1100 is used to ablate the silicon film. The ablated silicon atoms are then condensed on the GaAs substrate 1110 forming a thin film.

A typical laser source is XeCl whose wavelength is at 308 nm. The thickness of the silicon film 1106 should be greater than the optical absorption depth of the laser in silicon so that most of the laser energy is absorbed by the silicon film 1106. If the film does not absorb all the laser energy, the amount transmitted should be so minimal that no melting occurs in the GaAs substrate 1110. Since the surface of the GaAs substrate 1110 is not melted in the process, the silicon atoms from the silicon film 1106 are not incorporated into the GaAs substrate. Instead, a thin layer of amorphous silicon is deposited on the GaAs. This process can be repeated until a desired amount of amorphous silicon is deposited. This technique can be used to deposit a thin film over a large area simply by scanning the laser to scan over the area. Also, by using a film as a source, uniform deposition can be achieved.

Generally, during the deposition of a thin film, the substrate is heated up to a high temperature so that the molecules have enough energy to form the chemical bonds. Under the present invention, there is no need to heat the substrate material to high temperatures because of the increased kinetic energy associated with the dopants ablated from the source film. With the kinetic energy supplied by the dopants, this technique may not require additional thermal energy to be supplied to the substrate.

Figure 12:
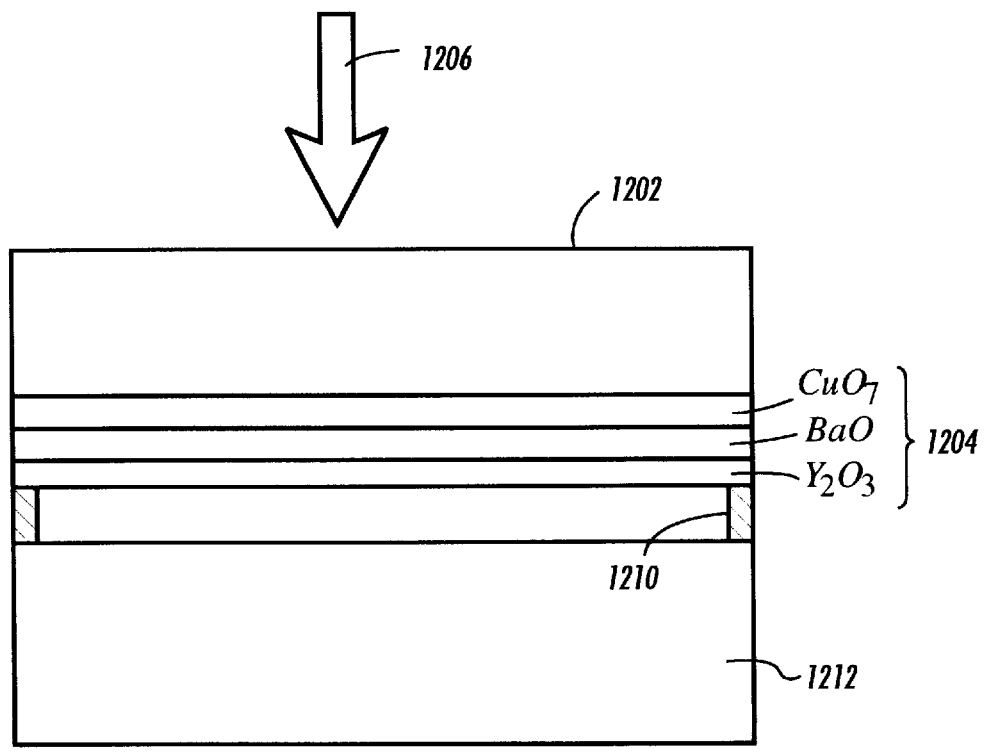
FIG. 12 illustrates the application of proximity laser ablation to the formation of a multi-component alloy.

FIG. 12 shows that the present invention allows the deposition of multi-component thin films from a source which contains the individual components. For instance, in FIG. 12, source films 1204 comprising of layers of $CuO_7$, BaO and $Y_2O_3$ are deposited on a source plate 1202. The plate 1202 is then placed in close proximity to a substrate 1212. When the laser 1206 ablates the source films 1204, YBa$_2$Cu$_3$O$_7$ which is a superconductive material, would be formed on the substrate 1212. The composition of the deposited film can be adjusted by modifying the relative thickness and composition of each individual source film. A typical source film thickness is 100 nm.

More importantly, this technique allows patterned deposition of thin films. Certain materials such as GaN, superconductors, and organic materials (e.g., triphenyldiamine derivatives or aluminum complex) for making light emitting diodes ("LEDs") are very hard to remove by etching. However, there are situations in which a deposited film is desired over some but not all areas of a substrate. In a traditional deposition process, a blanket film will be first deposited onto the substrate, which is followed by photolithographic masking. After the mask has been formed on the deposited film, the exposed areas are removed by etching. However, etching cannot readily remove certain materials such as GaN, which requires special etching tools. Of equal importance, since the etching process may damage the surface of the substrate, it is desirable to have a technique that will allow for patterned deposition of a material onto a substrate.

Under the present invention, the laser can selectively irradiate regions where deposition is desired. In effect, the desired deposition pattern is directly "written" onto the substrate by the movement of the laser. Since a typical beam size is about 1 micron, very fine pattern definitions can be achieved.

Figure 13:
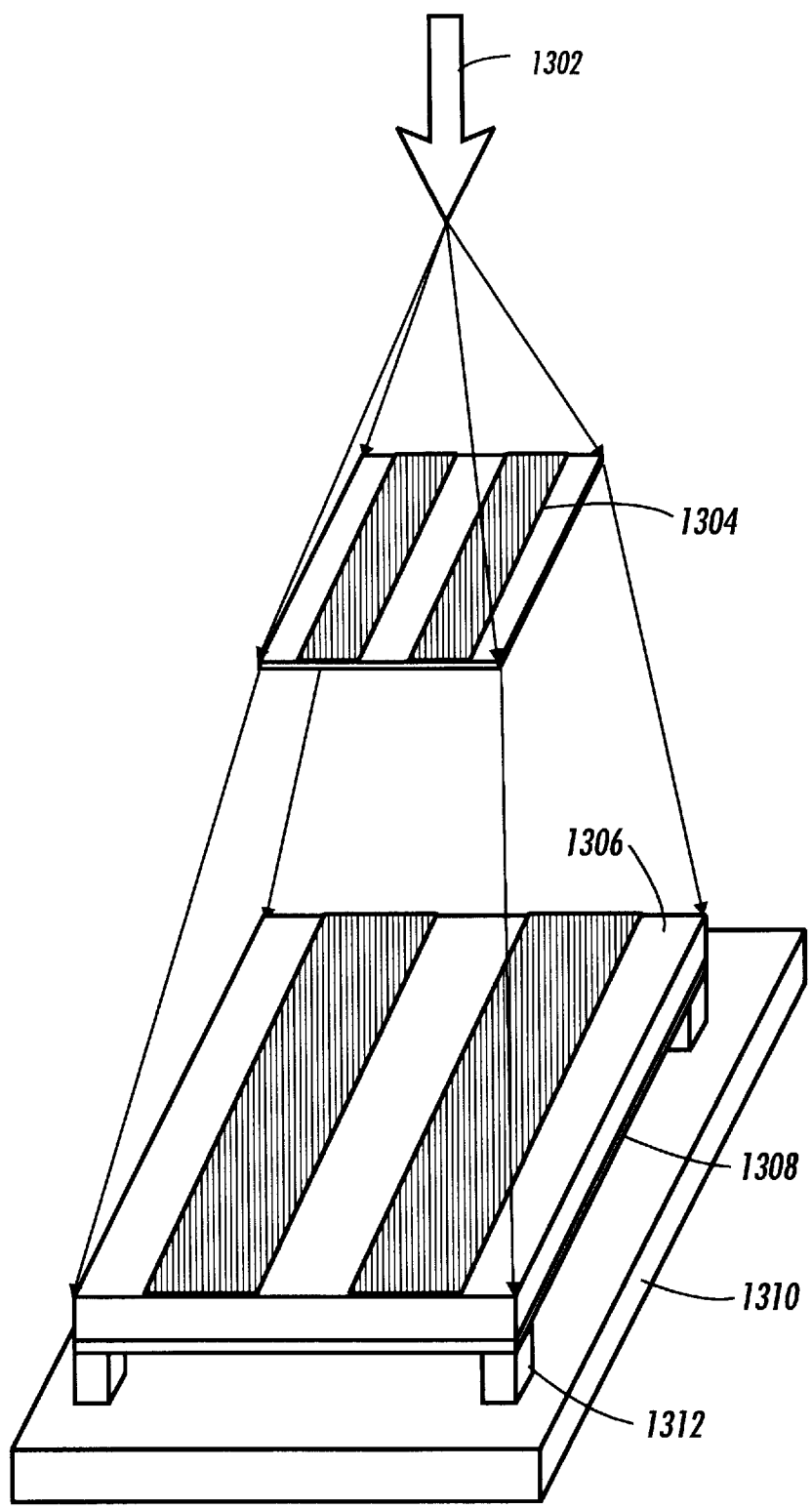
FIG. 13 illustrates the application of proximity laser ablation to patterned deposition of a thin film through a projection metal mask.

Another approach is through the use of a mask to block off the laser energy in areas where deposition is not desirable. The mask 1104 can be placed directly on the source plate 1102 as shown in FIG. 11. It can also be placed near the laser source in a manner that the mask would be projected onto the source film as shown in FIG. 13.

In short, this invention is not limited to the deposition of silicon on GaAs, but can also be applied to the deposition of materials onto other materials such as semiconductors, superconductors, or quartz. For instance, it can be applied to the deposition of Ge, GaN, or YBa$_2$Cu$_5$O$_7$ on silicon as well as Si or SiGe on superconductors.

While the present invention has been described in connection to specific embodiments, the present invention is not limited to such embodiments and encompasses modifications and equivalent arrangements within the scope of the appended claims.

What is claimed is:

1. A method of doping a semiconductor receptor material with a donor material, the method comprising the steps of:
    providing a source plate;
    providing a source layer on one side of said source plate, said source layer containing said donor material and being absorptive of laser energy;
    placing said source plate in close proximity to said receptor material with said one side facing said receptor material;
    irradiating said source layer with a laser source passing through said source plate, said step of irradiating resulting in ablating said source layer and melting a region of said receptor material;
    introducing said donor material ablated from said source film into said region of said receptor material for altering an electrical characteristic of said region.

2. The method of claim 1 wherein said source film is placed upon a source plate, which is transparent to laser energy.

3. The method of claim 1 wherein said laser source is a pulsed excimer laser.

4. The method of claim 1 wherein said electrical characteristic is the conductivity of said semiconductor receptor material.

5. The method of claim 1 wherein said semiconductor receptor material is silicon.

6. The method of claim 1 wherein said donor material is an n-type dopant to said semiconductor receptor material.

7. The method of claim 6 wherein said n-type dopant is phosphorus.

8. The method of claim 1 wherein said donor material is hydrogen.

9. The method of claim 8 wherein said donor material is silicon nitride containing hydrogen.

10. The method of claim 1 comprising the further steps of:
    moving said laser source from a first location to subsequent locations in accordance with a predefined pattern; and
    irradiating said source film at each of said locations so as to introduce said donor material ablated from said source film into said region of said semiconductor receptor material in accordance with said predefined pattern.

11. The method of claim 1 comprising the further steps of:
    placing a mask with a pattern between said laser source and said source film, wherein said mask is opaque to laser energy; and
    transferring said donor material ablated from said source film in the unmasked portion of said source film into said region of said semiconductor receptor material.

* * * * *